US006525388B1

(12) United States Patent
Shimawaki

(10) Patent No.: US 6,525,388 B1
(45) Date of Patent: Feb. 25, 2003

(54) COMPOUND SEMICONDUCTOR DEVICE HAVING DIODE CONNECTED BETWEEN EMITTER AND COLLECTOR OF BIPOLAR TRANSISTOR

(75) Inventor: Hidenori Shimawaki, Tokyo (JP)

(73) Assignee: NEC Compound Semiconductor Devices, Ltd., Kawasaki (JP)

( * ) Notice: Subject to any disclaimer, the term of this patent is extended or adjusted under 35 U.S.C. 154(b) by 175 days.

(21) Appl. No.: 09/708,420

(22) Filed: Nov. 9, 2000

(30) Foreign Application Priority Data

Nov. 11, 1999 (JP) ............................. 11-321824

(51) Int. Cl.[7] .......................................... H01L 27/095
(52) U.S. Cl. ...................................... 257/477; 257/197
(58) Field of Search ................................. 257/477, 197; 438/314, 328

(56) References Cited

U.S. PATENT DOCUMENTS 5,837,589 A * 11/1998 McNamara et al. ........ 438/314
6,046,486 A * 4/2000 McNamara et al. ........ 257/477

FOREIGN PATENT DOCUMENTS

| JP | 55-061063 | 5/1980 |
| JP | 61-216477 | 9/1986 |
| JP | 62-244172 | 10/1987 |
| JP | 3-64929 | 3/1991 |
| JP | 2000-357695 | 12/2000 |

* cited by examiner

Primary Examiner—Vu A. Le
Assistant Examiner—Bradley Smith
(74) Attorney, Agent, or Firm—McGinn & Gibb, PLLC

(57) ABSTRACT

A heterojunction bipolartansistor is fabricated on a semi-insulating substrate, and has a mesa structure, wherein an emitter signal line of titanium-platinum-gold alloy is held in contact with the collector layer as well as the emitter layer for forming a Schottky barrier diode connected between the emitter and the collector so that surge current flows before damage of the p-n junction of the heterojunction bipolar transistor.

21 Claims, 5 Drawing Sheets

COMPOUND SEMICONDUCTOR DEVICE HAVING DIODE CONNECTED BETWEEN EMITTER AND COLLECTOR OF BIPOLAR TRANSISTOR

FIELD OF THE INVENTION

This invention relates to a compound semiconductor device and, more particularly, to a compound semiconductor device having a bipolar transistor such as, for example, a heterojunction bipolar transistor.

DESCRIPTION OF THE RELATED ART

Various kinds of compound semiconductor such as, for example, gallium arsenide are used for fabricating electric components. A bipolar transistor is one of the electric components, and the electric components are usually fabricated on a semi-insulating substrate. Surge is unavoidable, and carriers are generated due to the surge. Since the semi-insulating substrate does not provide any discharging path to the carriers, the carriers are liable to be accumulated in the bipolar transistor. The accumulated carriers enhance the current gain, and this phenomenon is equivalent to prolongation of the life time of the minority carriers in the base region. These minority carriers give rise to increase of the majority carrier flowing into the base region. The emitter-base junction has a low breakdown voltage, and the surge is causative of the breakdown of the emitter-base junction. When the surge positively biases the emitter region with respect to the collector region, an extremely large amount of current flows between the emitter region and the collector region through the base region, and gives rise to serious stress. This means that the bipolar transistor requires surge withstand capability.

Several countermeasures have been proposed. One of the countermeasures is disclosed in Japanese Patent Publication of Unexamined Application No. 62-244172. FIGS. 1 and 2 show the first prior art semiconductor device disclosed in Japanese Patent Publication of Unexamined Application No. 62-244172. The first prior art semiconductor device includes a bipolar transistor and a diode connected between the base region and the collector region.

The first prior art semiconductor device is fabricated on a heavily-doped n-type silicon substrate 31. A lightly doped n-type epitaxial silicon layer 32 is grown on the major surface of the heavily doped n-type silicon substrate 31, and serves a the collector region of the bipolar transistor. A lightly-doped p-type silicon layer 33 is formed in the lightly-doped n-type epitaxial silicon layer 32, and serves as a base region of the bipolar transistor. A heavily-doped p-type silicon region 34 penetrates from the surface of the lightly-doped p-type silicon layer 33, and serves as a base contact region. A heavily-doped n-type silicon layer 35 is nested in the lightly-doped silicon layer 33, and is spaced from the heavily-doped p-type silicon region 34. The heavily-doped n-type silicon layer 35 serves as a multi-emitter region of the bipolar transistor.

A heavily-doped n-type silicon region 36 is further formed in a surface portion of the lightly-doped n-type epitaxial silicon layer 32, and laterally extends. The heavily-doped n-type silicon region 36 is held in contact with the heavily-doped p-type silicon region 34, and a Zener diode is implemented. The Zener diode is connected between the base region and the collector region, and prevents the bipolar transistor from the surge.

Another countermeasure is described in Japanese Patent Application No. 11-169321. The invention disclosed in Japanese Patent Application No. 11-169321 was transferred to the assignee of the present invention, and Japanese Patent Application No. 11-169321 will be published in December 2000. The semiconductor device disclosed in Japanese Patent Application No. 11-169321 is hereinbelow referred to as "unpublished semiconductor device".

The unpublished semiconductor device includes a heterojunction bipolar transistor and a diode connected between the collector region and the emitter region of the heterojunction bipolar transistor. The diode is implemented by a diode-connected heterojunction bipolar transistor, i.e., a heterojunction bipolar transistor having the base region short-circuited with the emitter region. The diode-connected heterojunction bipolar transistor enhances the surge withstand capability.

Yet another countermeasure is disclosed in Japanese Patent Publication of Unexamined Application No. 61-216477. The semiconductor device disclosed in Japanese Patent Publication of Unexamined Application No. 61-216477 is hereinbelow referred to as "second prior art semiconductor device".

The second prior art semiconductor device includes MOS (Metal-Oxide-Semiconductor) transistors. The MOS transistors form an output driving circuit so as to drive an output terminal. A protective MOS transistor is connected between the output terminal and the ground, and the gate electrode of the protective MOS transistor is grounded. The ground potential keeps the protective MOS transistor off, and the output driving circuit changes the potential level at the output terminal between the positive power voltage and the ground voltage. Surge voltage is assumed to be applied to the output terminal. The surge current flows through the channel of the protective MOS transistor as well as the channel of the MOS transistor forming a part of the output driving circuit. Thus, the protective MOS transistor provides a bypass to the surge current, and prevents the MOS transistor from the damage.

Although the Zener diode is effective against the surge applied between the base region and the collector region, the Zener diode can not prevent the bipolar transistor from surge applied between the emitter region and the collector region. The Japanese Patent Publication of Unexamined Application teaches the Zener diode formed in the epitaxial silicon layer. However, the Japanese Patent Publication of Unexamined Application is silent to a Zener diode to be formed in a semi-insulating substrate used for a compound semiconductor device. It is impossible to form any heavily-doped impurity region in the semi-insulating substrate. The Japanese Patent Publication of Unexamined Application does not teach how the Zener diode is formed on a semi-insulating substrate. Thus, the countermeasure in the first prior art semiconductor device is not applied to the compound semiconductor device.

Although the unpublished semiconductor device is a kind of compound semiconductor device, the countermeasure disclosed therein does not form any part of the prior art. However, the features of the countermeasure are discussed hereinbelow. First, the protective diode is implemented by the heterojunction bipolar transistor, the base region of which is connected to the emitter region. This means that the protective diode occupies a non-ignoreable amount of real estate. A p-n junction of the heterojunction bipolar transistor serves as the protective diode, and the potential barrier at the p-n junction is higher than a Schottky barrier. As a result, the protective diode has the relatively high turn-on voltage.

The second prior art semiconductor device is equipped with the protective MOS transistor. The protective MOS transistor has the grounded gate electrode, and the surge current flows through the MOS transistor to the ground. The problem inherent in the countermeasure of the second prior art semiconductor device is the occupation area as wide as the MOS transistor forming the part of the output driving circuit. Moreover, the Japanese Patent Publication of Unexamined Application is silent to how the countermeasure is applied to a bipolar transistor of a compound semiconductor device.

Thus, any one of the known countermeasures is not employable in a compound semiconductor device as a countermeasure against the surge applied between the emitter region and the collector region.

SUMMARY OF THE INVENTION

It is therefore an important object of the present invention to provide a compound semiconductor device, which has a countermeasure effective against surge positively biasing an emitter region with respect to a collector region.

To accomplish the object, the present invention proposes to form a Schottky barrier between a collector layer and an emitter signal line.

In accordance with one aspect of the present invention, there is provided a semiconductor device comprising a bipolar transistor fabricated on a semi-insulating substrate and including a collector of a first conductivity type, a base of a second conductivity type opposite to the first conductivity type and an emitter of the first conductivity type and a protective diode formed by a part of the collector and an emitter signal line held in contact with the emitter and the part of the collector.

BRIEF DESCRIPTION OF THE DRAWINGS

The features and advantages of the compound semiconductor device will be more clearly understood from the following description taken in conjunction with the accompanying drawings in which.

DESCRIPTION OF THE PREFERRED EMBODIMENTS

First Embodiment

Figure 1:
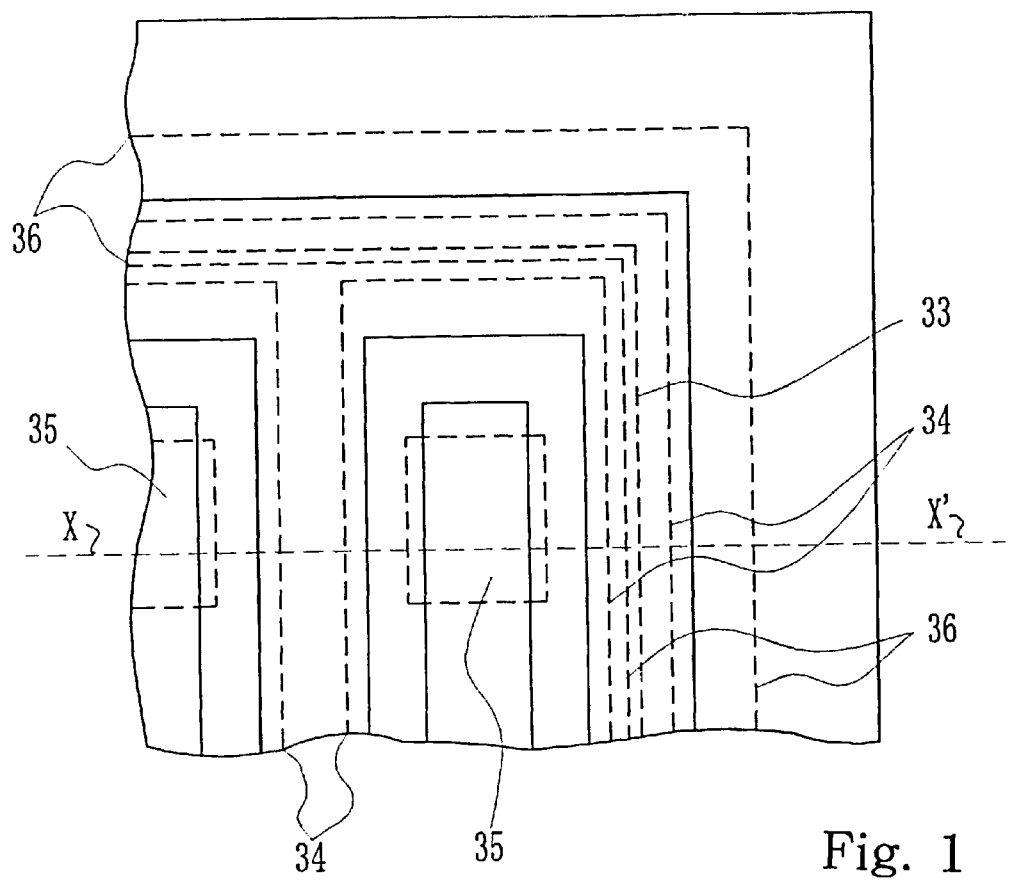
FIG. 1 is a plane view showing the layout of the impurity regions forming parts of the prior art bipolar transistor disclosed in Japanese Patent Publication of Unexamined Application No. 62-244172.
Figure 2:
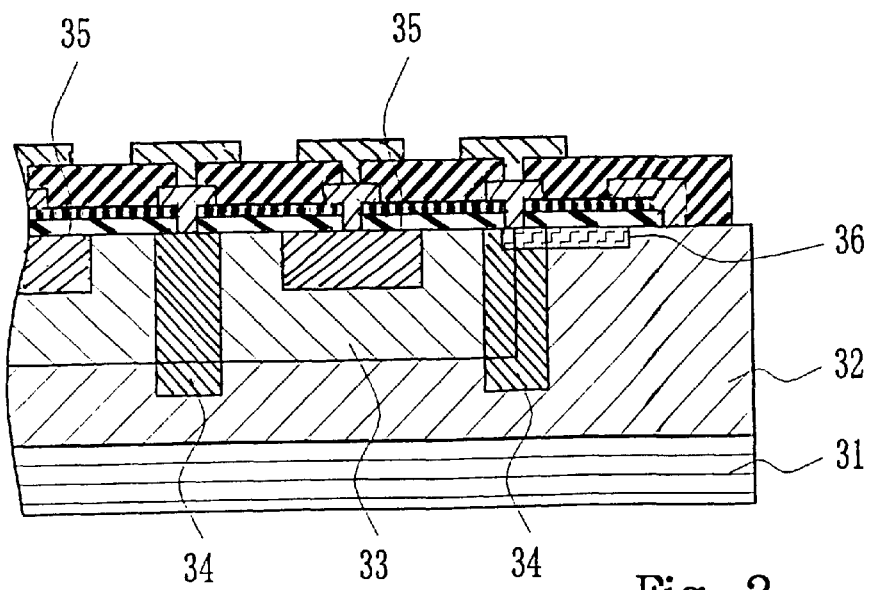
FIG. 2 is a cross sectional view taken along line X–X' of FIG. 1 and showing the structure of the prior art bipolar transistor.
Figure 3:
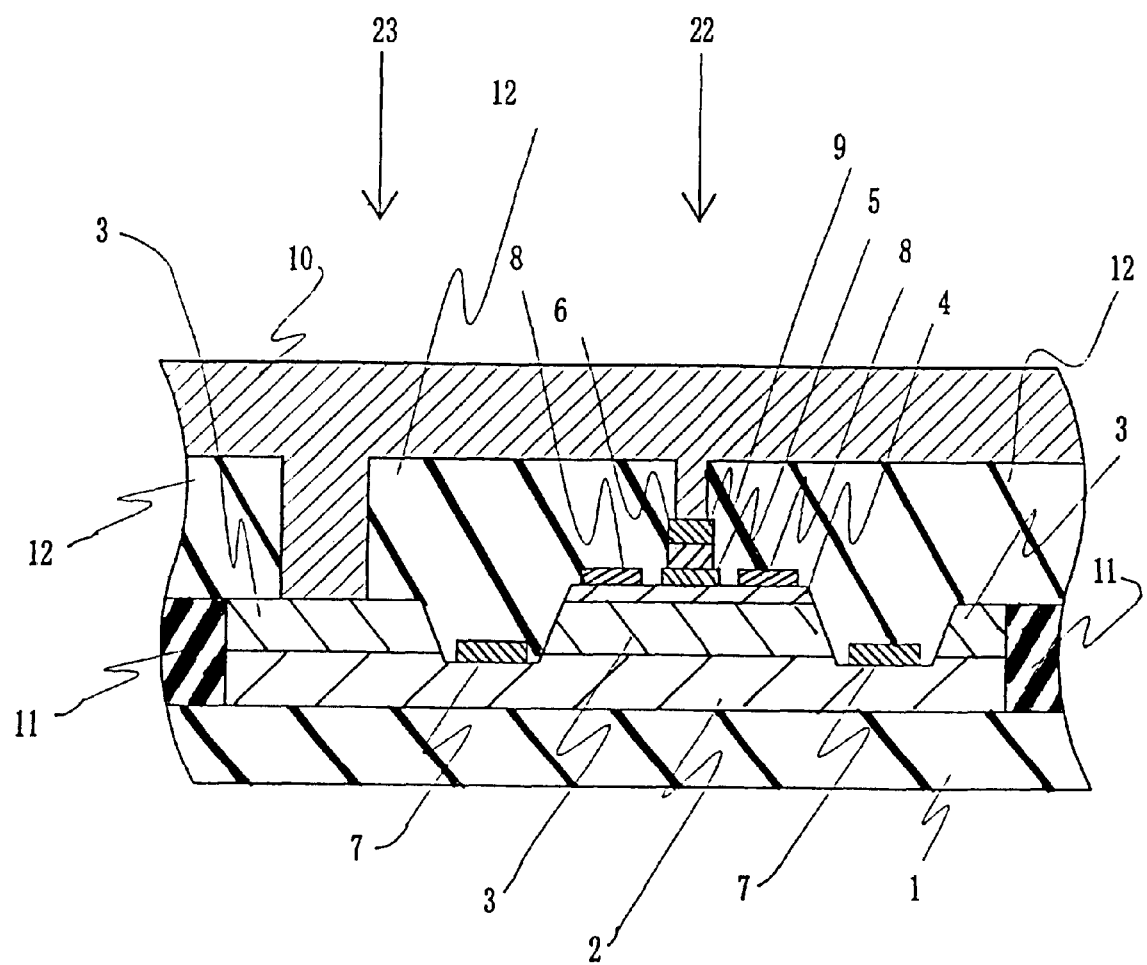
FIG. 3 is a cross sectional view showing the structure of a compound semiconductor device according to the present invention.
Figure 4:
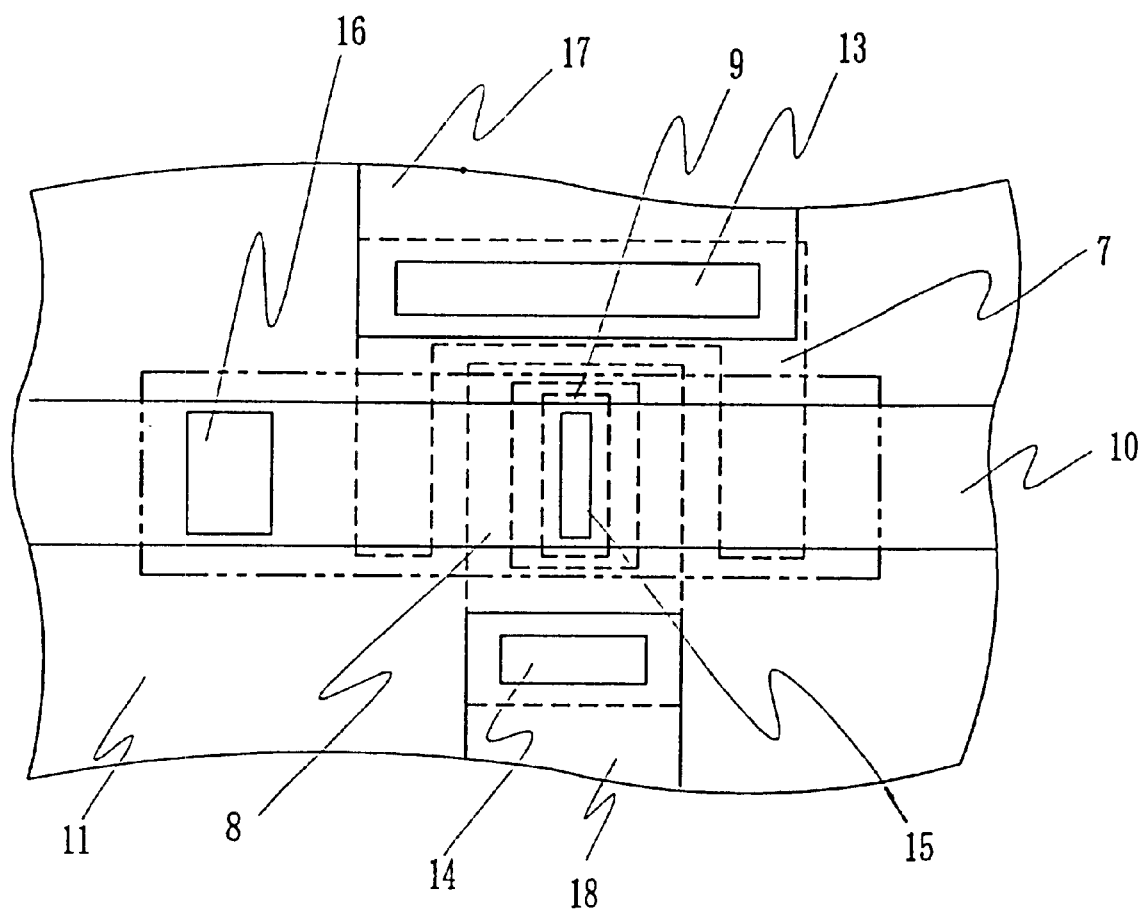
FIG. 4 is a plane view showing the layout of electrodes and wiring layers incorporated in the compound semiconductor device.
Figure 5:
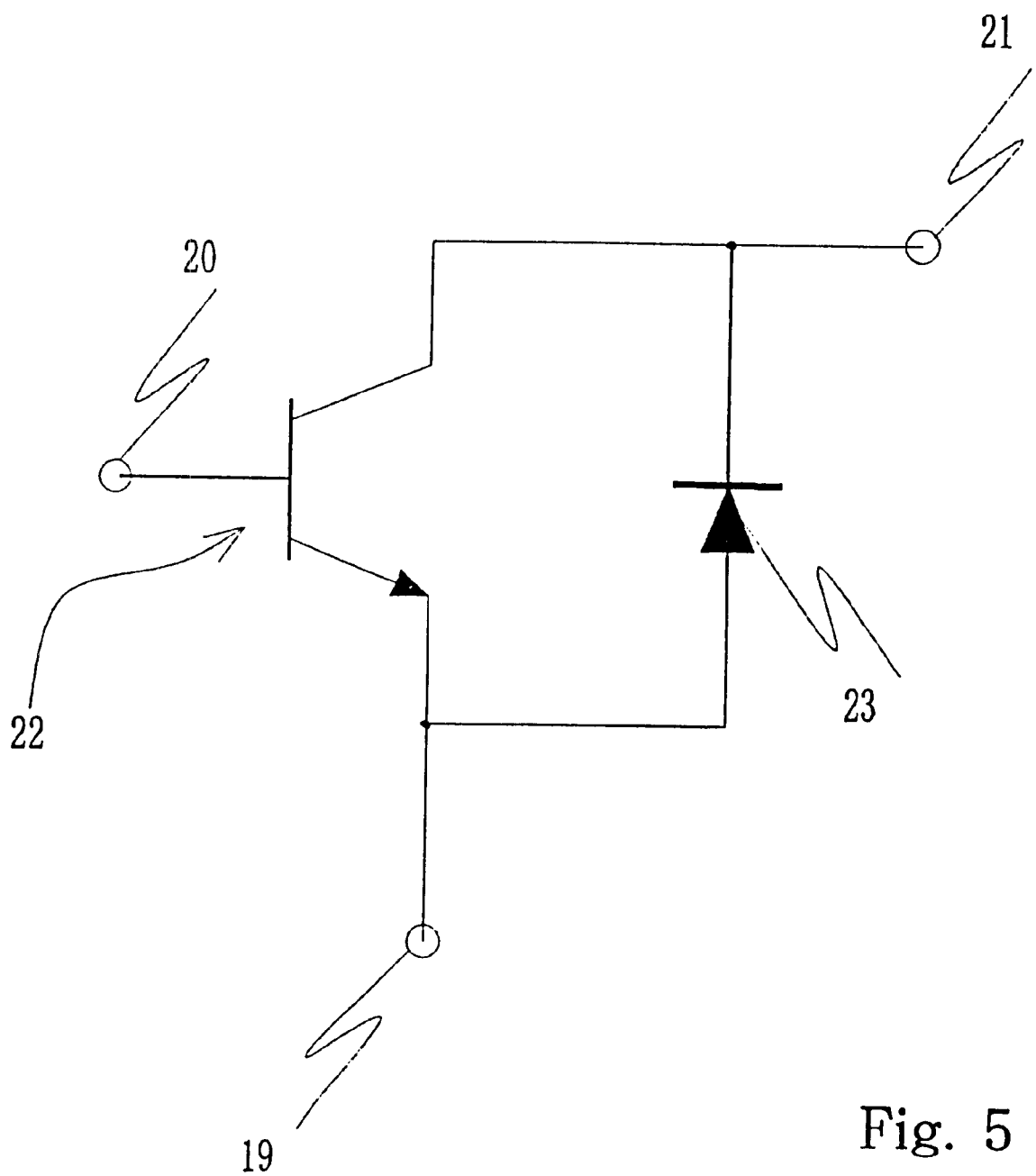
FIG. 5 is a circuit diagram showing an equivalent circuit of the compound semiconductor device.

Referring to FIGS. 3 and 4, a compound semiconductor device embodying the present invention is fabricated on a semi-insulating substrate 1 of gallium arsenide. The compound semiconductor device includes a heterojunction bipolar transistor 22 and a Schottky barrier diode 23. The Schottky barrier diode 23 has an anode and a cathode. The former is connected to the emitter terminal 19 of the heterojunction bipolar transistor 22, and the latter is connected to the collector terminal 21 of the heterojunction bipolar transistor 22 as shown in FIG. 5. Thus, the Schottky barrier diode 23 is connected between the emitter terminal 19 and the collector terminal 21. While the heterojunction bipolar transistor 22 is normally operating, the Schottky barrier diode 23 is turned off, and blocks the emitter terminal 19 from the collector terminal 21.

Surge is assumed to positively bias the emitter with respect to the collector. When the surge voltage exceeds the Schottky barrier, the surge current flows from the emitter through the Schottky barrier diode 23 to the collector. The Schottky barrier is lower than the potential barriers of the p-n junctions formed in the heterojunction bipolar transistor 22. For this reason, the surge current starts to flow before the p-n junctions are damaged. Thus, the Schottky barrier diode 23 prevents the p-n junctions of the heterojunction bipolar transistors from the surge.

Turning back to FIGS. 3 and 4, a collector contact layer 2 is grown on the semi-insulating substrate 1, and is formed of n-type gallium arsenide. A collector layer 3 is grown on the collector contact layer 2, and is formed of n-type gallium arsenide. The collector contact layer 2 and the collector layer 3 are buried in an isolating layer 11, and the collector layer 3 is partially removed so as to be separated into three positions. As a result, the collector contact layer 2 is exposed to the gap between the left portion and the central portion and between the central portion and the right portion. The isolating layer 11 is created through an ion-implantation of impurity, and electrically isolates the heterojunction bipolar transistor 22 from another electric element. The boundary between the isolating layer 11 and the collector layer 3 is indicated by using dots-and-dash line in FIG. 4.

A base layer 4 is grown on the central portion of the collector layer 3, and is formed of p-type gallium arsenide. A p-n junction is produced between the central portion of the collector layer 3 and the base layer 4. An emitter layer 5 is laminated on the base layer 3, and is formed of n-type aluminum gallium arsenide. A p-n junction is formed between the base layer 4 and the emitter layer 5. The emitter layer 5 has the forbidden band wider than that of the base layer 4. The emitter layer 5 is narrower than the base layer 4, and the base layer 4 is exposed on both sides of the emitter layer 5. The emitter layer 5 is overlain by an emitter contact layer 6, and the emitter contact layer 6 is formed of n-type gallium arsenide and n-type indium gallium arsenide.

A collector electrode 7 is bifurcated into two finger portions (see FIG. 4), and the two finger portions are held in contact with the collector contact layer 2 on both sides of the central portion of the collector layer 3. A base electrode 8 is held in contact with the base layer 4 around the emitter/emitter contact layers 5/6. An emitter electrode 9 is held in contact with the emitter contact layer 6. Thus, the collector contact layer 2, the collector layer 3, the base layer 4, the emitter layer 5 and the emitter contact layer 6, the collector electrode 7, the base electrode 8 and the emitter electrode 9 as a whole constitute the hetero-junction bipolar transistor 22. The collector electrode 7, the base electrode 8 and the emitter electrode 9 serve as the collector terminal 21, a base terminal 20 (see FIG. 5) and the emitter terminal 19, respectively. The hetero-junction bipolar transistor 22 is covered with an insulating layer 12, and contact holes 13, 14, 15 and 16 are formed in the insulating layer 12. The collector electrode 7 is exposed to the contact hole 13, and the base electrode 8 is exposed to the contact hole 14. The emitter electrode 9 is exposed to the contact hole 15. Conductive layers 17 and 18 are formed on the insulating layer 12, and are confronted to one another on both sides of a conductive alloy layer 10. The conductive layers 17 and 18 penetrate through the contact holes 13 and 14, respectively, and are held in contact with the collector electrode 7 and the base electrode 8, respectively.

The conductive alloy layer 10 is formed of titanium-platinum-gold alloy, i.e., Ti—Pt—Au alloy, and is patterned on the insulating layer 12. The conductive alloy layer 10 penetrates through the contact holes 15 and 16, and are held in contact with the emitter contact layer 6 and the left portion of the collector layer 3. The Schottky barrier takes place between the conductive alloy layer 10 and the left portion of the collector layer 3. The left portion of the collector layer 3 and a part of the conductive alloy layer 10 form in combination the Schottky barrier diode 23. Of course, the emitter current flows through the conductive alloy layer 10. Thus, the conductive alloy layer 10 partially serves as an emitter signal line and partially as the anode of the Schottky barrier diode 23.

In this instance, the collector contact layer 2 and the collector layer 3 as a whole constitute a collector, and the emitter layer 5 and the emitter contact layer 6 serve as an emitter.

The compound semiconductor device behaves as follows. While an emitter-base junction is forwardly biased, the current flows from the collector electrode 7 to the emitter electrode 9. The amount of current is dependent on the bias voltage between the base electrode 8 and the emitter electrode 9. The Schottky barrier diode 23 is turned off in so far as the emitter electrode 9 and the collector electrode 7 are appropriately biased.

If the surge voltage is applied between the emitter electrode 9 and the collector electrode 7, the Schottky barrier diode 23 turns on before the surge voltage damages the p-n junction, and the surge current flows through the Schottky barrier diode 23, and is discharged to the conductive layer 17.

As will be understood from the foregoing description, the Schottky barrier is formed between the collector layer 3 and the emitter signal line, and the Schottky barrier diode provides a current path from the emitter terminal 19 to the collector terminal 21. The Schottky barrier is lower than the p-n junctions. For this reason, the surge current starts to flow before the p-n junction are damaged. Thus, the Schottky barrier diode 23 is effective against the surge applied between the emitter terminal 19 and the collector terminal 21.

The Schottky barrier does not require any impurity region formed in the semi-insulating substrate 1. Thus, the countermeasure according to the present invention is employable in the compound semiconductor device fabricated on the semi-insulating substrate 1.

Finally, the Schottky barrier is much narrower than the area occupied by the hetero-junction bipolar transistor. For this reason, the compound semiconductor device is fabricated on a small semi-insulating substrate.

Second Embodiment

Figure 6:
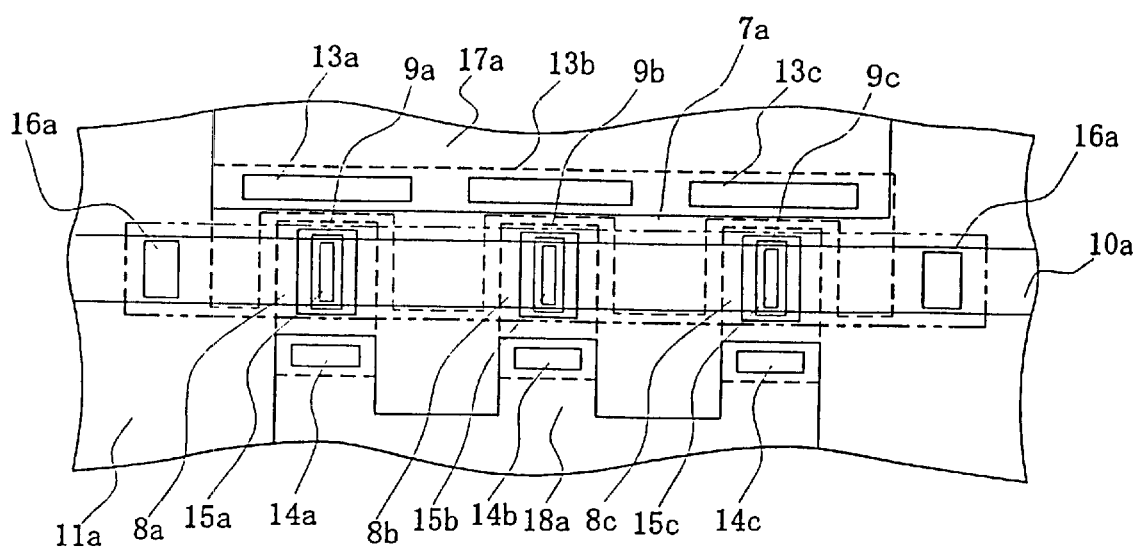
FIG. 6 is a plane view showing the layout of electrodes and wiring layers incorporated in another compound semiconductor device according to the present invention.

Turning to FIG. 6 of the drawings, another compound semiconductor device embodying the present invention comprises plural heterojunction bipolar transistors connected in parallel and two Schottky barrier diodes formed on both sides of the parallel combination of heterojunction bipolar transistors. The plural heterojunction bipolar transistors form a multi-fingered heterojunction bipolar transistor array. The plural heterojunction bipolar transistors are similar in structure to the heterojunction bipolar transistor forming the part of the compound semiconductor device implementing the first embodiment. Although the emitter layers and the base layers are provided for the individual heterojunction bipolar transistors, the collector contact layer is shared between the plural heterojunction bipolar transistors.

Base electrodes 8a, 8b and 8c are provided for the plural heterojunction bipolar transistors, respectively, and emitter electrodes 9a, 9b and 9c are also provided for the plural heterojunction bipolar transistors, respectively. However, a collector electrode 7a is shared between the plural heterojunction bipolar transistors. The collector electrode 7a is shaped into a comb-like configuration. The collector layer is separated into plural portions, and the comb-like collector electrode 7a is held in contact with the collector contact layer exposed to the gaps between the portions of the collector layer.

The plural heterojunction bipolar transistors are covered with an insulating layer, and collector contact holes 13a/13b/13c, base contact holes 14a/14b/14c, emitter contact holes 15a/15b/15c and diode contact holes 16a are formed in the insulating layer. The collector contact holes 13a/13b/13c are located over the collector electrode 7a. The base electrodes 8a, 8b and 8c are exposed to the base contact holes 14a, 14b and 14c, respectively, and the emitter electrodes 9a, 9b and 9c are exposed to the emitter contact holes 14a, 14b and 14c, respectively. The diode contact holes 16a are positioned over the leftmost portion and the rightmost portion of the collector layer, and, accordingly, the leftmost portion and the rightmost portion are exposed to the diode contact holes 16a, respectively.

Conductive layers 10a, 17a and 18a are patterned on the insulating layer, and serve as an emitter signal line, a collector line and a base signal line, respectively. The conductive layer 10a extends over the emitter electrodes 9a/9b/9c and the collector contact layer, and penetrates through the emitter contact holes 15a/15b/15c and the diode contact holes 16a so as to be held in contact with the emitter electrodes 9a/9b/9c, the leftmost portion of the collector layer and the rightmost portion of the collector layer. Schottky barriers are produced between the leftmost portion of the collector layer and the emitter signal line and between the rightmost portion of the collector layer and the emitter signal line, respectively, and the Schottky diodes are connected between the emitter and the collector of the leftmost heterojunction bipolar transistor and between the emitter and the collector of the rightmost heterojunction bipolar transistor, respectively.

Surge is assumed to positively bias the emitters with respect to the collectors. When the surge voltage exceeds the Schottky barrier height, the Schottky barrier diodes turns on, and surge current flows through the Schottky barrier diodes to the collector line 17a. The Schottky barrier is lower than the potential barrier of the p-n junctions of the heterojunction bipolar transistors. For this reason, the p-n junction of the heterojunction bipolar transistors are not damaged. Thus, the Schottky barrier diodes serve as protective diodes against the surge.

Although particular embodiments of the present invention have been shown and described, it will be apparent to those skilled in the art that various changes and modifications may be made without departing from the spirit and scope of the present invention.

For example, the semi-insulating substrate may be formed of another kind of compound semiconductor such as, for example, indium phosphide InP. The heterojunction bipolar transistor may be in another compound semiconductor system such as, for example, InGaP/GaAs system, InP/InGaAs system or Si/SiGe system.

The collector layer may be formed of undoped compound semiconductor or by a laminated structure of n-type compound semiconductor layer and undoped compound semiconductor layer.

Another kind of alloy or metal such as, for example, aluminum may be used for the Schottky barrier.

What is claimed is:

1. A semiconductor device comprising:
   a bipolar transistor fabricated on a semi-insulating substrate and including a collector of a first conductivity type, a base of a second conductivity type opposite to said first conductivity type and an emitter of said first conductivity type, and
   a protective diode formed by a part of said collector and an emitter signal line held in contact with said emitter and said part of said collector.

2. The semiconductor device as set forth in claim 1, in which said protective diode has a Schottky barrier between said part of said collector and said emitter signal line.

3. The semiconductor device as set forth in claim 2, in which said Schottky barrier is lower in potential than a p-n junction formed in said bipolar transistor.

4. The semiconductor device as set forth in claim 2, in which said collector and said emitter signal line comprise a compound semiconductor and at least one of an alloy and a metal, respectively.

5. The semiconductor device as set forth in claim 4, in which said alloy includes titanium, platinum and gold.

6. The semiconductor device as set forth in claim 1, in which said collector, said base and said emitter respectively comprise a first kind of compound semiconductor of said first conductivity type, said first kind of compound semiconductor of said second conductivity type and a second kind compound semiconductor of said first conductivity type.

7. The semiconductor device as set forth in claim 6, in which said collector, said base and said emitter are laminated on said semi-insulating substrate so as to form a mesa-structure.

8. The semiconductor device as set forth in claim 7, in which said collector includes a collector contact layer and a collector layer, which is separated into a plurality of portions at intervals on said collector contact layer, and said emitter signal line is held in contact with one of said plurality of portions for producing a Schottky barrier of said protective diode.

9. The semiconductor device as set forth in claim 7, in which said mesa-structure is buried in an insulating layer, and said emitter signal line passes through at least one contact hole formed in said insulating layer so as to be held in contact with said emitter and said part of said collector.

10. The semiconductor device as set forth in claim 6, in which said second kind of compound semiconductor has a band gap wider than the band gap of said first kind of compound semiconductor.

11. The semiconductor device as set forth in claim 6, in which said first kind of compound semiconductor of said first conductivity type is held in contact with said at least one of said alloy and said metal used for said emitter signal line so as to form a Schottky barrier of said protective diode.

12. The semiconductor device as set forth in claim 11, in which said first kind of compound semiconductor and said second kind of compound semiconductor include gallium arsenide and aluminum gallium arsenide, respectively, and said alloy includes titanium, platinum and gold.

13. The semiconductor device as set forth in claim 1, said first conductivity type an said second conductivity type are n-type and p-type, respectively, and said protective diode includes an anode connected to said emitter and a cathode connected to said part of said collector.

14. The semiconductor device as set forth in claim 1, in which said semi-insulating substrate comprises a first kind of compound semiconductor that is undoped.

15. The semiconductor device as set forth in claim 14, in which said first kind of compound semiconductor is used for said collector of said first conductivity type and said base of said second conductivity type, and said emitter is formed of a second kind of compound semiconductor different in composition from said first kind of compound semiconductor.

16. The semiconductor device as set forth in claim 15, in which said first kind of compound semiconductor and said second kind of compound semiconductor include gallium arsenide and aluminum gallium arsenide, respectively.

17. The semiconductor device as set forth in claim 15, in which said first kind of compound semiconductor produces a Schottky barrier together with at least one of an alloy and a metal comprising said emitter signal line.

18. The semiconductor device as set forth in claim 17, in which said Schottky barrier is a lower potential barrier than corresponding potential barriers of p-n junctions of said bipolar transistor.

19. The semiconductor device as set forth in claim 1, in which said bipolar transistor forms a transistor array together with other bipolar transistors connected in parallel to one another and to said bipolar transistor, and a collector of said transistor array is shared between said bipolar transistor and said other bipolar transistors.

20. A compound semiconductor device comprising:
    a semi-insulating substrate including an undoped compound semiconductor;
    a heterojunction bipolar transistor including:
       a collector laminated on said semi-insulating substrate and comprising a first kind of compound semiconductor of a first conductivity type,
       a base laminated on a part of said collector and comprising said first kind of compound semiconductor of a second conductivity type opposite to said first conductivity type,
       an emitter laminated on a part of said base and comprising a second kind of compound semiconductor of said first conductivity type,
       a collector electrode that connects with another part of said collector,
       a base electrode held in contact with another part of said base, and
       an emitter electrode held in contact with said emitter; and
    an emitter signal line held in contact with said emitter electrode and yet another part of said collector so as to form a Schottky barrier diode connected between said emitter and said collector.

21. The compound semiconductor device as set froth in claim 20, in which said heterojunction bipolar transistor is covered with an insulating layer, and said emitter signal line is formed on said insulating layer in such a manner as to be held in contact with said part of said collector and said emitter electrode through corresponding contact holes formed in said insulating layer.

* * * * *